US 6,710,360 B2

(12) United States Patent
Ferrara

(10) Patent No.: US 6,710,360 B2
(45) Date of Patent: Mar. 23, 2004

(54) ADJUSTABLE IMPLANTATION ANGLE WORKPIECE SUPPORT STRUCTURE FOR AN ION BEAM IMPLANTER

(75) Inventor: Joseph Ferrara, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/192,344

(22) Filed: Jul. 10, 2002

(65) Prior Publication Data

US 2004/0007678 A1 Jan. 15, 2004

(51) Int. Cl.$^7$ ................................................ H01J 37/00
(52) U.S. Cl. .................... 250/492.21; 250/281; 250/287
(58) Field of Search ................................. 250/281, 287

(56) References Cited

U.S. PATENT DOCUMENTS

| | | | |
|---|---|---|---|
| 4,761,559 A | | 8/1988 | Myron |
| 4,975,586 A | * | 12/1990 | Ray ........................ 250/492.2 |
| 5,229,615 A | | 7/1993 | Brune et al. |
| 5,436,790 A | | 7/1995 | Blake et al. |
| 5,444,597 A | | 8/1995 | Blake et al. |
| 6,163,033 A | * | 12/2000 | Smick et al. .......... 250/441.11 |
| 6,207,959 B1 | | 3/2001 | Satoh et al. |
| 6,222,196 B1 | * | 4/2001 | Mack ..................... 250/492.21 |

* cited by examiner

Primary Examiner—John R. Lee
Assistant Examiner—Zia R. Hashmi
(74) Attorney, Agent, or Firm—Watts Hoffman Co., L.P.A.

(57) ABSTRACT

An ion beam implanter includes an ion beam source for generating an ion beam moving along a beam line and a vacuum or implantation chamber wherein a workpiece is positioned to intersect the ion beam for ion implantation of a surface of the workpiece by the ion beam. The ion beam implanter further includes a workpiece support structure coupled to the implantation chamber and supporting the workpiece. The workpiece support structure includes a rotation member rotatably affixed to the implantation chamber. Rotation of the rotation member with respect to the implantation chamber changes an implantation angle of the workpiece with respect to the portion of the ion beam beam line within the implantation chamber. The workpiece support structure further includes a translation member movably coupled to the rotation member and supporting the workpiece for linear movement along a path of travel. The traslation member moves along a direction of movement such that a distance that the ion moves through the implantation chamber remains constant during movement of the workpiece along its path of travel.

31 Claims, 5 Drawing Sheets

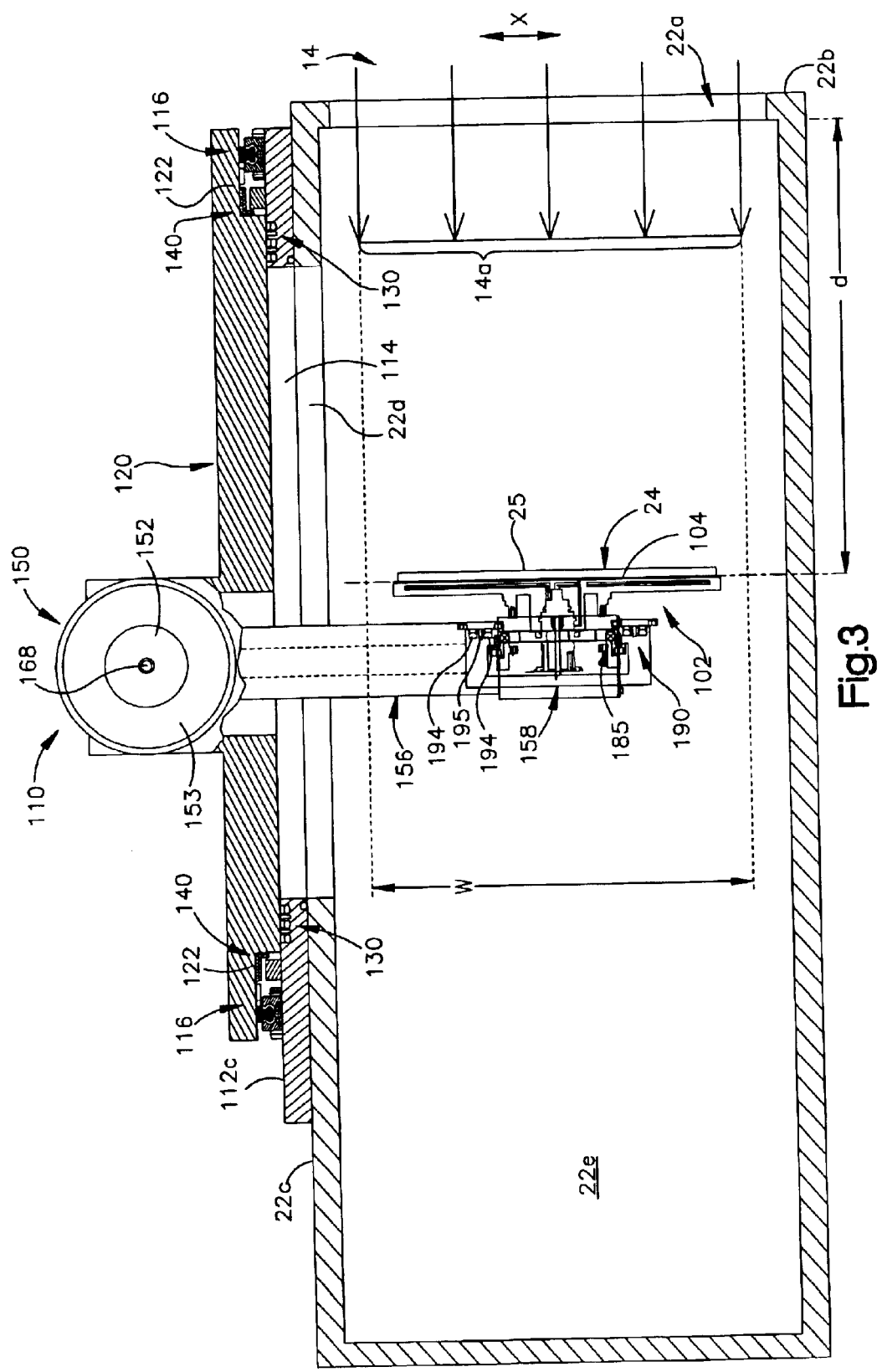

ADJUSTABLE IMPLANTATION ANGLE WORKPIECE SUPPORT STRUCTURE FOR AN ION BEAM IMPLANTER

FIELD OF THE INVENTION

The present invention relates to an adjustable implantation angle workpiece support assembly or structure coupled to an implantation chamber of an ion beam implanter and, more particularly, to a workpiece support assembly or structure that provides for rotational and linear movement of a workpiece with respect to an ion beam such that an implantation angle of the workpiece may be selected and the workpiece translated along a linear path at the selected implantation angle wherein a distance from an ion beam entrance to the implantation chamber to the intersection of the ion beam and an implantation surface of the workpiece remains constant during translation of the workpiece.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, substrate or flat panel, thereby "doping" or implanting the workpiece surface with desired ions. Some ion implanters utilize serial implantation wherein a single, relatively large wafer workpiece is positioned on a support in an implantation chamber and implanted. The implantation occurs one workpiece at a time. The support is oriented such that the workpiece is in the ion beam beam line and the ion beam is repetitively scanned over the workpiece to implant a desired dosage of ions. When the implantation is complete, the workpiece is removed from the support and another workpiece is positioned on the support for implantation.

In recent years, the trend in the semiconductor industry has been to use increasingly larger wafer workpieces, for example, 300 mm. diameter wafers. The ability to implant large wafer workpieces or other workpieces such as flat panels has become very desirable. One way to implant a workpiece serially is to move it in front of a scanned, fanned or ribbon ion beam. Such an ion beam is wide enough so that the entire width of the workpiece can be implanted uniformly. In order to implant the entire workpiece, a second motion transverse to a direction or extent of the ion beam is required. Further, it is often desired to be able to change an angle of implantation for a particular workpiece being implanted. The angle of implantation is the angle of incidence formed between the ion beam and the treatment surface of the workpiece. An implantation angle of 0 degrees means that an implantation surface of the workpiece is normal to the ion beam beam line.

One shortcoming of workpiece support structures of prior art ion beam implanters is that, other than an implantation angle of 0 degrees, movement of the workpiece along a path of travel perpendicular to the ion beam beam line causes a distance that the beam travels within the implantation chamber before striking the workpiece implantation surface to change. Stated another way, if the implantation angle is not 0 degrees, the workpiece can be viewed as being tilted with respect to the ion beam beam line. If such a tilted workpiece is moved perpendicularly with respect to the ion beam beam line, when portions of the workpiece tilted toward the ion beam are being implanted, a distance that the ion beam travels in the implantation chamber before striking the implantation surface will be reduced compared to the beam distance at a center of the workpiece implantation surface. On the other hand, when portions of the workpiece tilted away from the ion beam are being implanted, a distance that the ion beam travels in the implantation chamber before striking the implantation surface will be greater compared to a beam distance at a center of the workpiece implantation surface.

Obviously, the larger the workpiece and the greater the implantation angle is from 0 degrees, the greater the difference in the beam distance traversed by the ion beam within the implantation chamber as implantation moves from one end of the workpiece implantation surface to an opposite end of the implantation surface. As the ion beam tends to diffuse over its beam path, non-constant beam distance may have an adverse effect on achieving a uniform ion dosage implantation over an entirety of the workpiece implantation surface. Thus, the trend toward larger wafers exacerbates this non-constant beam distance problem.

To insure uniform implantation of a workpiece implantation surface, it would be desirable to maintain a substantially constant beam distance traversed by ion beam within the implantation chamber before striking the implantation surface of the workpiece. What is desired is a workpiece support structure that provides the capability of selecting a desired implantation angle and then maintaining a substantially constant beam distance between entry of the ion beam into the implantation chamber and impacting the implantation surface while the workpiece is moved with respect to the ion beam beam line during the implantation procedure.

SUMMARY OF THE INVENTION

One exemplary embodiment of the present invention concerns an ion beam implanter having a workpiece support structure for supporting a workpiece within a vacuum or implantation chamber. The ion beam implanter includes an ion beam source for generating an ion beam moving along a path of travel and being scanned along an axis. A workpiece is supported by the workpiece support structure in the implantation chamber such that the workpiece is positioned to intersect the path of travel of the scanned ion beam for implantation of a implantation surface of the workpiece by the ion beam. Advantageously, the workpiece support structure provides for: a) selecting a desired implantation angle; and b) moving the workpiece for implantation of the implantation surface by the ion beam while maintaining a substantially constant beam distance between entry of the ion beam into the implantation chamber and striking the implantation surface.

The workpiece support structure is coupled to the implantation chamber and supports the workpiece. The workpiece support structure includes a rotation member rotatably coupled to the implantation chamber, the rotation member having an axis of rotation perpendicular to a path of the ion beam within the implantation chamber wherein rotation of the rotation member with respect to the implantation chamber changing an implantation angle of the workpiece with respect to the path of the ion beam in the implantation chamber. The workpiece support structure further includes a translation member movably coupled to the rotation member and supporting the workpiece for linear movement along a path of travel in a direction transverse to the ion beam while maintaining the selected implantation angle.

Advantageously, a distance between entry of the ion beam into the implantation chamber and an intersection of the ion beam and a surface of the workpiece remains substantially constant during movement of the workpiece along its path of travel.

These and other objects, advantages, and features of the exemplary embodiment of the invention are described in detail in conjunction with the accompanying drawings.

BRIEF DESCRIPTION OF THE DRAWINGS

FIG. 3 is the same schematic top plan view of the implantation chamber and wafer support structure of FIG. 2 with the workpiece support structure in an implantation position.

DETAILED DESCRIPTION

Figure 1:
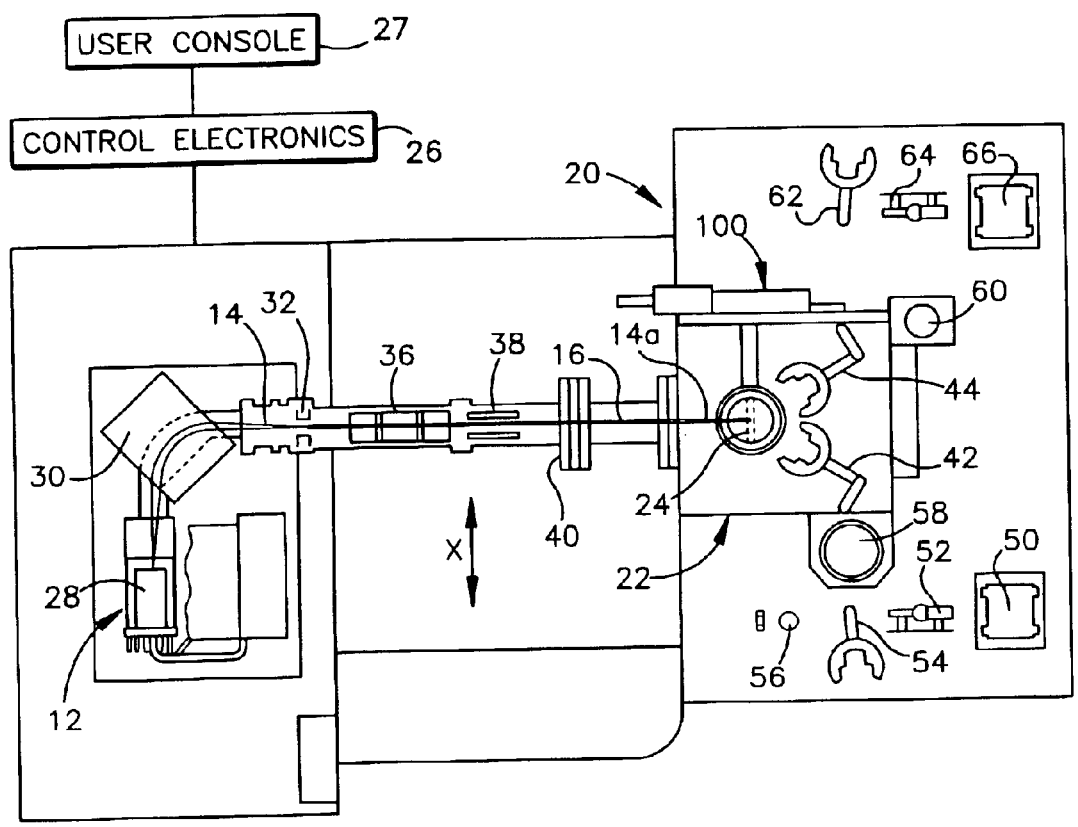
FIG. 1 is a schematic plan view of an ion beam implanter of the present invention.

Turning to the drawings, an ion beam implanter is shown generally at 10 in FIG. 1. The implanter includes an ion source 12 for creating ions that form an ion beam 14 which traverses a beam path 16 to an end or implantation station 20. The implantation station includes a vacuum or implantation chamber 22 defining an interior region 22e in which a workpiece 24 such as a semiconductor wafer or a flat panel or a substrate is positioned for implantation by the ion beam 16. Control electronics (shown schematically at 26) are provided for monitoring and controlling the ion dosage received by the workpiece 24. Operator input to the control electronics 26 are performed via a user console 27.

The ion source 12 generates the ion beam 14 which impacts the workpiece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadruple lens system 36 that focuses the beam 14. The beam path 16 extends through deflection electrodes 38, 40 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 22 through an opening 22a in a front wall 22b of the chamber 22. A ribbon ion beam 14a is an ion beam that essentially has the shape of a very narrow rectangle that is, a beam that extends in one direction, e.g., has a horizontal or x direction extent (shown as W in FIGS. 2 and 3) with very limited extent in the orthogonal direction, e.g., in the vertical or y direction.

Generally, the extent of the ribbon ion beam 14a is sufficient to implant the entire corresponding dimension of the workpiece 24, that is, if the ribbon ion beam 14a traversing the implantation chamber 22 extends in the horizontal or x direction (FIG. 1) and the workpiece 24 has a horizontal dimension of 300 mm. (or a diameter of 300 mm.). The control electronics 26 will appropriately energize the electrode 38 such that a horizontal extent, W, of the ribbon ion beam 14a, upon striking the workpiece 24 within the implantation chamber 22, will be at least 300 mm. The electrode 38 deflects the beam 14 and a parallelizing lens 40 is positioned along the beam line 16 to correct for the beam angle deflection caused by the electrode 38 such that the ribbon ion beam 14a is parallel when it implants the workpiece 24.

As will be explained below, a workpiece support structure 100 both supports and moves the workpiece 24 with respect to the ribbon ion beam 14 during implantation such that an entire implantation surface 25 of the workpiece 24 is uniformly implanted with ions. In addition to the scanning technique described above, those of skill in the art will recognize that the ribbon shape of the ribbon ion beam 14a within the implantation chamber 22 can be created in a number of ways. For example, an arc slit of the plasma chamber 28 may be shaped such that the ion beam as created has a ribbon shape from inception. The present invention is not limited to the use of any particular technique or structure to shape or form the ion beam.

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

The implantation chamber interior region 22c is evacuated. Two robotic arms 42, 44 mounted within the implantation chamber 22 automatically load and unload wafer workpieces to and from a workpiece support assembly or structure 100. The workpiece 24 is shown in a horizontal loading position in FIG. 1. Prior to implantation, the workpiece support structure 100 rotates the workpiece 24 to a vertical or near vertical position for implantation. If the workpiece 24 is vertical, that is, normal with respect to the ion beam 14, the implantation angle or angle of incidence is 0 degrees. It has been found that to minimize undesirable channeling effects, typically, a small but nonzero implantation angle is selected.

In a typical implantation operation, undoped workpieces are retrieved from a first cassette 50 by a shuttle 52 which brings a workpiece 24 to the vicinity of a robotic arm 54 which moves the workpiece to an orienter 56, where the workpiece 24 is rotated to a particular crystal orientation. The arm 54 retrieves the oriented workpicce 24 and moves it into a loading station 58 adjacent the implantation chamber 22. The loading station 58 closes, is pumped down to a desired vacuum, and then opens into the implantation chamber 22. The first arm 42 within the implantation station 22 grasps the workpiece 24, brings it within the implantation chamber 22 and places it on an electrostatic clamp or chuck 102 of the workpiece support structure 100. The electrostatic clamp 102 is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion implantation of the workpiece 24, the workpiece support structure 100 returns the workpiece 24 to a horizontal position and the electrostatic clamp 102 is denergized to release the workpiece. The second arm 42 of the implantation station 22 grasps the implanted workpiece 24 and moves it from the implantation chamber 22 to an unload station 60. From the unload station 60, a robotic arm 62 moves the implanted workpiece 24 to a shuttle 64 which places the workpiece into a second cassette 66.

The workpiece support structure 100 is operated by the control electronics 24, supports the workpiece 24 during implantation, and, advantageously, permits both rotational and translational movement of the workpiece 24 with respect to the ribbon ion beam 14a within the implantation chamber 22. By virtue of its rotational capability, the workpiece support structure 100 advantageously permits selection of a desired implantation angle (IA) or angle of incidence between the ion beam 14 and an implantation surface 25 of the workpiece 24.

Figure 4:
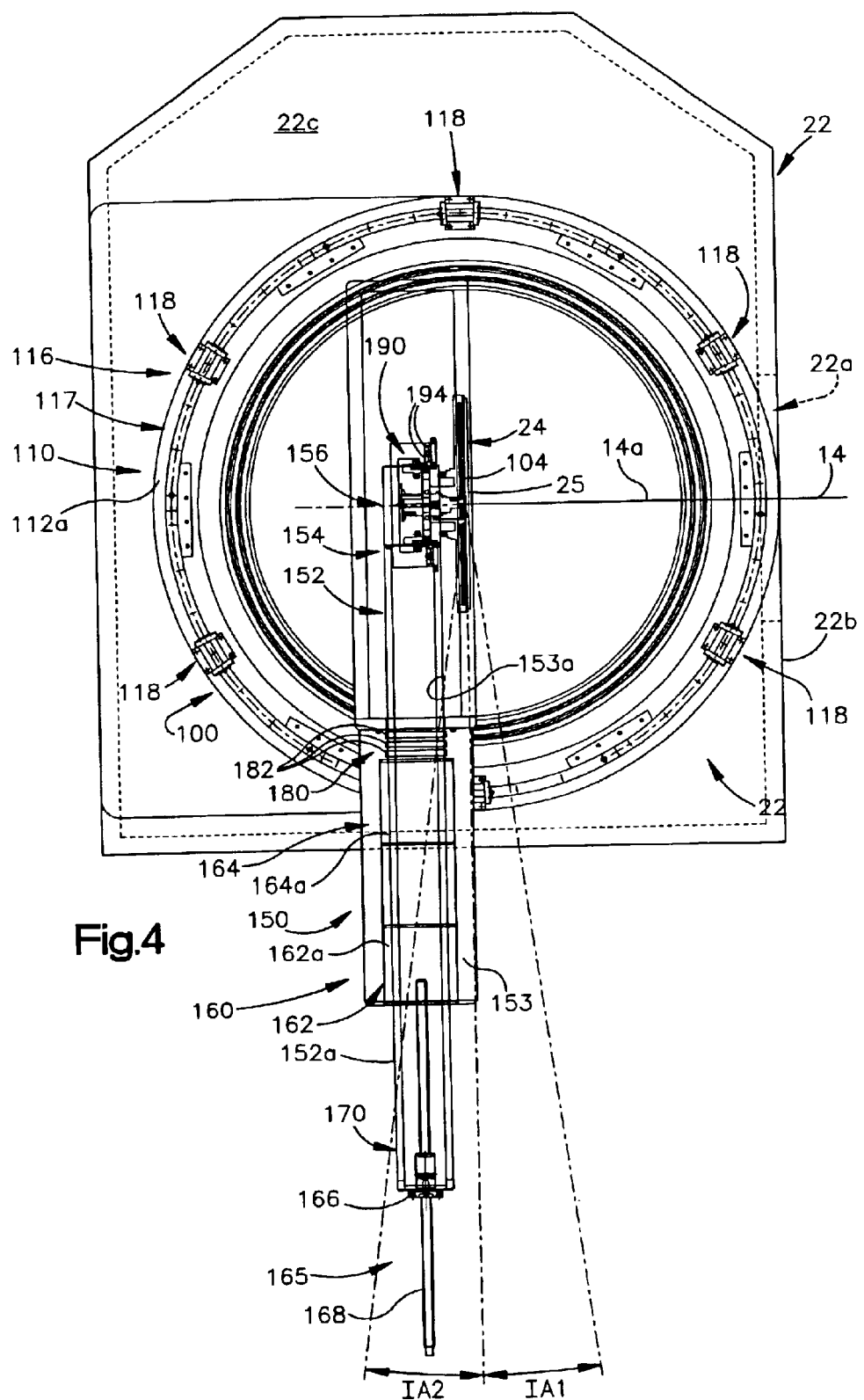
FIG. 4 is a schematic side elevation view the implantation chamber and workpiece support structure of FIG. 2.

By virtue of its translational or linear movement capability, the workpiece support structure 100 permits the implantation surface of the workpiece 24 to be moved along a plane coincident with the desired implantation angle (IA) during implantation thereby both maintaining the desired implantation angle and additionally keeping substantially constant a distance d (FIGS. 3 and 4) that the ribbon ion beam 14a travels from its entry into the implantation chamber interior region 22e to the point (actually a line because the ion beam is a ribbon ion beam) where it impacts the implantation surface 25 of the workpiece 24. This substantially constant distance is maintained during the during entire implantation of the implantation surface 25. That is, the substantially constant distance is maintained as the workpiece 25 moves transversely with respect to the ribbon ion beam 14a, in a plane coincident with the desired implantation angle (IA) such that the entire implantation surface is implanted from one end 25a of the implantation surface 25 to the opposite end 25b(FIG. 4).

The maintenance of a substantially constant distance or path of travel for the ion beam 14a between the implantation chamber 22 and the impact of the ion beam 14a on the workpiece 24 is highly desirable for uniform ion implantation characteristics over the entire implantation surface 25 of the workpiece 24. Another way of looking at the workpiece support structure 100 is that it permits a substantially constant path of travel of the ion beam 14 from the ion source 12 to the point were it impacts the workpiece implantation surface 25.

As is customary in the industry, when the ion beam 14 is perpendicular to the implantation surface 25 of the workpiece 24, the implantation angle, LA, is defined as zero degrees. Two non-zero implantation angles are shown as dashed lines IA1 and IA2 in FIG. 4. In the position shown in IA1, the workpicce 24 would be tilted such that a top surface of the workpiece is tilted toward the ribbon ion beam 14a In the position shown in IA2, the workpiece 24 would be tilted such that a bottom surface of the workpiece is titled toward the ribbon ion beam 14a. The position of the workpiece 24 with respect to the ribbon ion beam 14a shown in solid line in FIGS. 3 and 4 has an implantation angle, IA, equal to 0 degrees, that is, the implantation surface 25 of the workpiece 24 is normal to the direction of the ion beam. To minimize detrimental channeling effects often times a non-zero implantation angle may be selected for implantation of the workpicce 24.

During a production run, semiconductor wafer workpieces or flat panel workpieces are serially implanted. That is, when one workpiece's implantation is completed, the electrostatic clamp 102 is denergized to release the workpiece and implanted workpiece is automatically removed from the implantation chamber 22 and another workpiece is positioned on an support surface 104 the electrostatic clamp 102 and the clamp is suitably energized to securely hold the workpiece 24 on the support surface 104.

Figure 2:
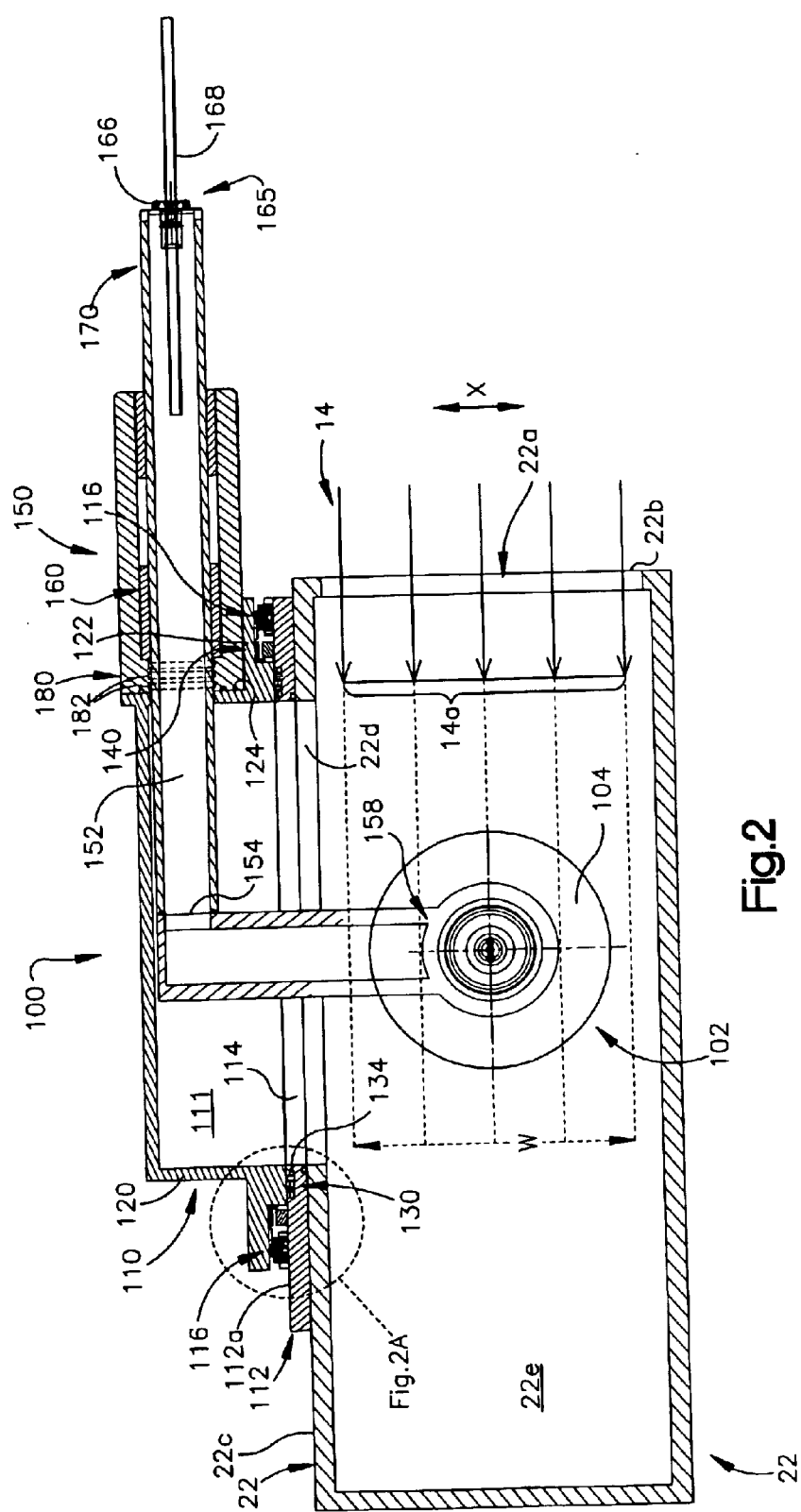
FIG. 2 is a schematic top plan view of an implantation chamber and associated workpiece support structure of the ion beam implanter of FIG. 1 with the wafer support structure in a loading and unloading position.

The workpicce support structure 100 is best shown in FIGS. 2–4. FIGS. 1 and 2 are top plan views showing the electrostatic clamp 102 in the workpiece loading and unloading position. After a workpiece 24 is loaded on the support surface 104 of the electrostatic clamp 102, the workpiece support structure 100 rotates the workpiece to an implantation position, such as the position shown in FIG. 3 (IA=0 degrees). FIG. 3 is a top plan view showing the electrostatic clamp 102 supporting the workpiece 24 in an implantation position. FIG. 1 shows the workpiece 24 in the implantation position in dashed line.

During implantation of the workpiece 24, the workpiece support structure 100 moves the workpiece 24 in a direction transverse to the ribbon ion beam 14a such that the entire implantation surface 25 is appropriately impacted and implanted with desired ions. As can be seen in the schematic depictions in FIGS. 2 and 3, the ribbon ion beam 14a at a point of impact with the workpicce 24 has a width W in the X direction which is greater than the diameter of the workpiece 24, thus, no translation of the workpiece in the X direction is required for full implantation of the workpiece.

As can best be seen in FIGS. 2–4, the workpiece support structure 100 is affixed to a side wall 22c of the implantation chamber 22 and extending into the interior region 22e of the implantation chamber 22 through an opening 22d in the implantation chamber side wall 22c. The workpiece support structure 100 includes a rotation member 110 and an integral translation member 150. The workpiece support structure rotation member 110 includes a stationary flat support plate 112. The support plate 112 is affixed to the implantation chamber 22 and, preferably, to the implantation chamber side wall 22c The support plate 112 includes an opening 114 aligned with the opening 22d of the implantation chamber side wall 22c.

Figure 2A:
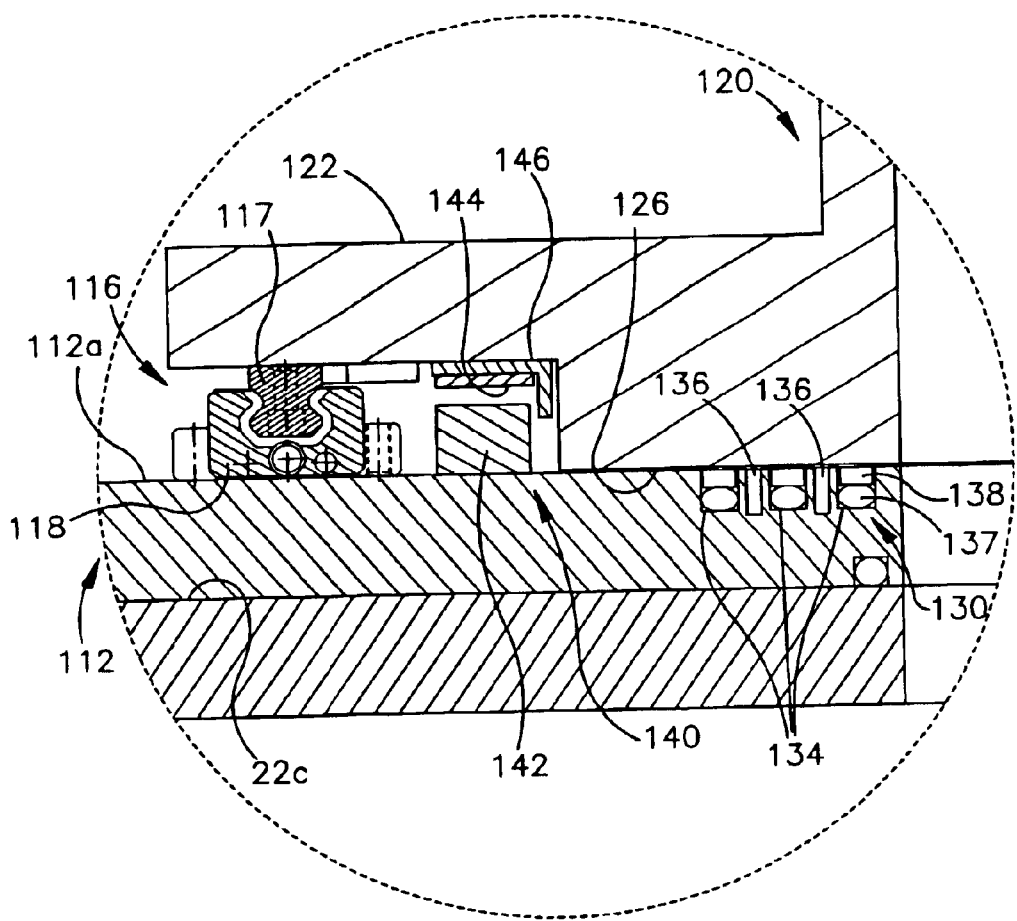
FIG. 2A is a schematic representation of a portion of the implantation chamber and workpiece support structure shown in dashed line in FIG. 2.

The rotation member 110 also includes a hub 120 which is rotatably coupled to the implantation chamber 22 and, more specifically, is rotatably coupled to the support plate 112 of the rotation member 110. The hub 120 is attached to the support plate 112 by means of a bearing assembly 116. As can best be seen in FIGS. 2A and 4, preferably, the bearing assembly 116 is a circular bearing assembly including a circular rail support 117 affixed to a stepped outer portion 122 of the hub 120 and six spaced apart bearing ways 118 which are affixed to an upper surface 112a of the support plate 112. A plurality of ball or roller bearings are disposed in each of the six ways 118. The bearings of the ways 118 bear against and roll along the rail support 117 to provide for rotation of the hub 120 with respect to the implantation chamber 22.

Alternately, the bearing assembly 116 may be a different type of conventional mechanical bearing assembly such as ball or roller bearings supported within a bearing cage and disposed between and inner and outer races as would be recognized by one of ordinary skill in the art. Additionally, the bearing assembly 116 may be a non-contact gas bearing assembly could be suitably employed as would be recognized by one of ordinary skill in the art.

Rotation of the hub 110 with respect to the support plate 112 and implantation chamber 22 is preferably achieved by use of a circular track linear motor 140. The linear track motor 140 is shown schematically in FIG. 2A. The circular track linear motor 140 comprises electromagnetic coils 142 arranged in a circular pattern and affixed to the upper surface 112*a* of the support plate 112. The circular track linear motor 140 further includes a corresponding set of permanent magnets 144 supported on a magnet track plate 146. The magnet track plate 146 is affixed to the stepped outer portion 122 of the hub 120. The electromagnetic coils 142 are appropriately energized by the control electronics 26 to precisely control rotation of the hub 110 with respect to the implantation chamber 22.

Vacuum is maintained between the interior region 22*e* of the implantation vacuum chamber and outside atmosphere by means of differentially pumped circular vacuum seal system 130. The vacuum seal system 130 is a contact type vacuum seal. As can best be seen in FIG. 2A, the vacuum seal system 130 includes three circular recesses or grooves 134 separated by two circular channels 136 machined or formed in the upper surface 112*a* of the support plate 112. Disposed in each of the three grooves 134 is an O-ring 137 and a plastic seal 138 having a substantially square cross section. An upper surface of each of the three seals 138 bears against a bottom or lower surface 126 of the hub 120.

The channels 136 are in fluid communication with a vacuum pump (not shown) via orifices (not shown) in the support plate 112. The vacuum pump, which would be affixed to the support plate, would be operated to draw a vacuum in the channels 136 thereby removing any air and/or contaminants that happen to leak from the outside atmospheric environment through the two seals formed by the outer and middle O-ring 137 and plastic seal 138 combinations. In addition to a differentially pumped circular vacuum seal system, other seal system designs such as a lip seal or other polymer material seal designs would also be suitable and are within the contemplated scope of the present invention.

Additionally, non-contact vacuum seal systems would also be suitable as a vacuum seal system. In a non-contact vacuum seal system, O-rings and plastic seals are not utilized. Instead one or more circular channels (such as channels 136) would be machined in the upper surface 112*a* of the support plate 112. The channels would be in fluid communication with vacuum pump coupled to the support plate 112. The vacuum pump would be operated to draw a vacuum in the circular channels.

The rotation member 110 allows for a greater than +/−70 degree rotation of the workpiece 24 inside the implantation chamber 22 with respect to the ribbon ion beam 14*a*. The centerline C—C (shown in dashed line in FIG. 3) of the rotation member 110 is aligned with the front of the workpiece implantation surface 25.

The workpiece support structure 100 further includes the translation or reciprocating member 150 which is integral with the rotation member 110. As can best be seen in FIG. 2, the translation member 150 includes a scan shaft 152 that is supported by a cylindrical scan shaft support housing 153 attached to a side wall 124 of the rotation member hub 120. The scan shaft 152 extends partially inside the rotation member interior region 111. The scan shaft 152 provides for linear translational movement of the workpiece 24 along a plane coincident with the selected implantation angle (IA). As can best be seen in FIG. 2, extending orthogonally from an upper end 154 of the scan shaft 152 is a work piece holder 156. The workpiece holder 156 extends though the opening 114 in the support plate and the opening 22*d* in the implantation chamber side wall 22*c*. The workpiece holder 156 terminates in a circular distal end 158 (best seen in FIG. 2).

The distal end 158 of the workpiece holder 156 supports the electrostatic clamp 102 which, in turn, supports the workpiece 24 for movement in front of the ribbon ion beam 14*a*.

The scan shaft 152 is supported inside the cylindrical scan shaft support housing 153 by means of a bearing assembly 160. The bearing assembly 160 (best seen in FIG. 4) preferably comprises two spaced apart gas bearings 162, 164 to effectively support the large moment arm of the scan shaft 152. The gas bearings 162, 164 each comprise a gas permeable sleeve 162*a*, 164*a* supported within the scan shaft support housing 153. Gas, such as, for example, nitrogen or air, is pumped inwardly through a width of the sleeves 162*a*, 164*a*thereby supporting the scan shaft 152 on a very thin layer gas. The sleeves 162*a*, 164*a* may either constitute a material, such as a bronze or graphite, with appropriate openings drilled through the width of the sleeves 162*a*, 164*a* or, alternatively, the sleeves 162*a*, 164*a* may be fabricated of a naturally permeable material such as graphite. Alternately, the bearing assembly 160 may be a mechanical bearing system such as those discussed with respect to bearing assembly 116 as would be known to those of skill in the art.

Linear motion of the scan shaft 152 is achieved by use of a linear motor or ball screw system. Shown in FIG. 4 is part of a ball screw drive assembly 165 for driving the scan shaft 153. The ball screw drive assembly includes a ball nut 166 affixed to a lower end 170 of the scan shaft 152. A ball screw 168 extends through the ball nut 166. A motor (not shown), coupled the hub, engages and rotates the ball screw 168 to move the scan shaft 152 linearly. The motor operates under the direction of the control electronics 26.

A non-contact vacuum radial seal system or assembly 180 is provided to seal the interior area 111 from atmosphere by sealing between an exterior cylindrical surface 1 52*a* of the scan shaft 152 and an interior cylindrical surface 153*a* of the scan shaft housing 153. Preferably, the vacuum seal assembly 180 comprises three channels 182 (best seen in FIG. 4) machined or formed in the interior surface 153*a* of the scan shaft housing 153. The channels are in fluid communication with a vacuum pump (not shown) via orifices (not shown). The vacuum pump is operated to prevent air and/or contaminants from leaking between the scan shaft 152 and the scan shaft housing 153 into the implantation chamber interior region 22*e*. Alternately, the seal assembly 180 may be a differentially pumped circular vacuum seal system such as the assembly described with respect to circular vacuum seal system 130.

The reciprocating linear motion of the scan shaft 152 during implantation is perpendicular to a normal vector of the workpiece implantation surface 25. Stated another way, linear movement of the scan shaft 152 causes movement of the workpiece 24 within a plane coincident with the selected implantation angle (IA). Multiple independent degrees of freedom or motion are advantageously achieved by combination of the reciprocating linear motion of the translation member 150 within the rotational member 110. This allows for constant focal length scanning of the workpiece 24 in front of the ion beam 14. In other words, a distance from the impact point of the ion beam on the workpiece implantation surface 25 to the ion beam 14 entrance into the implantation chamber 22 is always constant for all rotation angles, that is, all implantation angles (IA).

The workpiece 24 is held with respect to the work piece holder 156 by means of the electrostatic clamp or chuck 102. The electrostatic chuck 102 is cooled in order to remove the energy or heat that is transferred from the workpiece 24 during implantation. In order to allow for quad or octal implants, preferably, the electrostatic clamp 102 is operatively coupled to a motor so that the workpiece support surface 104 of the clamp 102 can rotate within the work piece holder 156 up to 360 degrees. The rotational centerline of the electrostatic clamp 102, shown as dashed line D in FIG. 4, is aligned with a centerline of the workpiece 24. The electrostatic clamp 102 rotation is achieved by means of an electric motor (not shown)that is mounted within the workpiece holder distal end 158 and connected to the electrostatic clamp 102 by a suitable drive means such as a belt or cable (not shown) or, alternatively, the electric motor may be directly coupled to the electrostatic clamp 102. The electrostatic chuck 102 is mounted within the workpiece holder distal end 158 by means of a bearing assembly 185. The bearing assembly 185 is preferably a ball or roller bearing assembly. The bearing assembly 185 preferably comprises ball or roller bearings supported within a bearing cage and disposed between and arcuate inner and outer races affixed to or formed in the corresponding surfaces of the workpiece holder distal end 158 and the reverse side of the electrostatic clamp 102.

Alternately, the bearing assembly 185 may be a non-contact gas bearing.

A vacuum between the electrostatic clamp 102 and workpiece holder distal end 158 is maintained by means of a face vacuum seal system or assembly 190. The vacuum seal system 190 is needed because the interior regions of the scan shaft 152 and the work piece holder distal end 158 are both at atmospheric pressure. Preferably, the vacuum seal system 190 is a differentially pumped radial vacuum seal system similar to the differentially pumped circular vacuum seal assembly 130. As was the case with the vacuum seal assembly 130, as can best be seen in FIG. 4, O-rings and plastic seals are disposed in two respective circular grooves 194 disposed in a side cylindrical wall of the work piece holder 156. The two plastic seals have a generally square cross section and the outer surface of the respective seals bears against a corresponding back flat surface of the electrostatic clamp 102. A circular channel 195 is disposed between the two circular grooves 184 and is pumped by a vacuum pump (not shown) attached to the work piece holder 156. The vacuum drawn in the channel 195 removes air and or contaminants that may leak past the inner seal defined by the O-ring and plastic seal combination.

In addition to a differentially pumped face vacuum seal system 190, other seal system designs such as a ferrofluidic seal or a lip seal or other polymer material seal designs would also be suitable for the vacuum seal system 190 and are within the contemplated scope of the present invention. Non-contact vacuum seal systems, such as the vacuum seal system 180 described above, would also be suitable for the vacuum seal system 190.

While the present invention has been described with a degree of particularity, it is the intent that the invention include all modifications and alterations from the disclosed design falling with the spirit or scope of the appended claims.

What is claimed is:

1. An ion beam implanter comprising:
   a) an ion beam source for generating an ion beam moving along a beam line;
   b) an implantation chamber defining an evacuated interior region wherein a workpiece is positioned to intersect the ion beam for ion implantation of an implantation surface of the workpiece by the ion beam; and
   c) workpiece support structure coupled to the implantation chamber and supporting the workpiece, the workpiece support structure including:
      1) a rotation member coupled to the implantation chamber for changing an implantation angle of the workpiece with respect to a portion of the ion beam within the implantation chamber, the rotation member defining an interior region in fluid communication with the implantation chamber evacuated interior region; and
      2) a translation member movably coupled to the rotation member and supporting the workpiece for movement along a path of travel wherein movement of the translation member maintains a constant distance that the ion beam moves through the implantation chamber before striking the implantation surface of the workpiece, the translation member including a scan shaft extending longitudinally and moving in a direction parallel to the path of travel of the workpiece, at least a portion of the scan shaft extending into the rotation member interior region.

2. The ion beam implanter of claim 1 wherein the rotation member has an axis of rotation perpendicular to the portion of the ion beam within the implantation chamber.

3. The ion beam implanter of claim 1 wherein the path of travel of the workpiece is a linear path of travel.

4. The ion beam implanter of claim 1 wherein movement of the translation member is perpendicular to the axis of rotation of the rotation member and parallel to the implantation surface of the workpiece.

5. The ion beam implanter of claim 1 wherein the scan shaft is supported for movement by a scan shaft support housing attached to a side wall of the rotation member.

6. The ion beam implanter of claim 5 wherein the translation member further includes a workpiece holder coupled to the scan shaft and extending inside the implantation chamber and comprising an electrostatic clamp for holding the workpiece.

7. The ion beam implanter of claim 6 wherein the electrostatic clamp is rotatable with respect to the ion beam.

8. The ion beam implanter of claim 1 wherein the rotating member is coupled to a support plate by a bearing assembly, the support plate being affixed to the implantation station.

9. The ion beam implanter of claim 1 wherein a vacuum is maintained between the implantation chamber and the rotating member by a circular vacuum seal.

10. The ion beam implanter of claim 1 wherein the translation member is integral with the rotation member.

11. An ion beam implanter comprising:
   a) an ion beam source for generating an ion beam moving along a beam line;
   b) an implantation chamber wherein a workpiece is positioned to intersect the ion beam for ion implantation of a surface of the workpiece by the ion beam; and
   c) workpiece support structure coupled to the implantation chamber and supporting the workpiece, the workpiece support structure including:
      1) a rotation member coupled to the implantation chamber for changing an implantation angle of the workpiece with respect to a portion of the ion beam within the implantation chamber, the rotation member defining an interior region adjacent the implantation chamber; and
      2) a translation member movably coupled to the rotation member and supporting the workpiece for movement along a path of travel wherein movement of the translation member is parallel to the implantation surface of the workpiece the translation member including a scan shaft extending longitudinally and moving in a direction parallel to the path of travel of the workpiece, at least a portion of the scan shaft extending into the rotation member interior region.

12. The ion beam implanter of claim 11 wherein a distance between a position where the ion beam enters the implantation chamber and an intersection of the ion beam and a surface of the workpiece remains constant during movement of the workpiece along its path of travel.

13. The ion beam implanter of claim 11 wherein the rotation member has an axis of rotation perpendicular to the portion of the ion beam within the implantation chamber.

14. The ion beam implanter of claim 11 wherein the path of travel of the workpiece is a linear path of travel.

15. The ion beam implanter of claim 11 wherein movement of the translation member is perpendicular to the axis of rotation of the rotation member.

16. The ion beam implanter of claim 11 wherein the translation member scan shaft is supported for movement by a scan shaft support housing attached to a side wall of the rotation member.

17. The ion beam implanter of claim 16 wherein the translation member further includes a workpiece holder coupled to the scan shaft and extending inside the implantation chamber and comprising an electrostatic clamp for holding the workpiece.

18. The ion beam implanter of claim 16 wherein the electrostatic clamp is rotatable with respect to the ion beam.

19. The ion beam implanter of claim 11 wherein the rotation member is coupled to the implantation station by a bearing assembly.

20. The ion beam implanter of claim 11 wherein a vacuum is maintained between the implantation chamber and the rotation member by a circular vacuum seal.

21. The ion beam implanter of claim 11 wherein the translation member is integral with the rotation member.

22. A workpiece support assembly for an ion beam implanter generating an ion beam moving along a beam line and including an implantation chamber wherein a workpiece is positioned to intersect the ion beam for ion implantation of an implantation surface of the workpiece by the ion beam, the workpiece support assembly comprising:

a) a rotation member coupled to the implantation chamber for changing an implantation angle of the workpiece with respect to a portion of the ion beam within the implantation chamber, the rotation member defining an interior region adjacent the implantation chamber; and b) a translation member movably coupled to the rotation member and supporting the workpiece for movement along a path of travel wherein movement of the translation member maintains a constant distance that the ion beam moves through the implantation chamber before striking the implantation surface of the workpiece, the translation member including a scan shaft extending longitudinally and moving in a direction parallel to the path of travel of the workpiece, at least a portion of the scan shaft extending into the rotation member interior region.

23. The workpiece support assembly of claim 22 wherein the rotation member has an axis of rotation perpendicular to the portion of the ion beam within the implantation chamber.

24. The workpiece support assembly of claim 22 wherein the path of travel of the workpiece is a linear path of travel.

25. The workpiece support assembly of claim 22 wherein movement of the translation member is perpendicular to the axis of rotation of the rotation member and parallel to the implantation surface of the workpiece.

26. The workpiece support assembly of claim 22 wherein the translation member scan shaft is supported for movement by a scan shaft support housing attached to a side wall of the rotation member.

27. The workpiece support assembly of claim 26 wherein the translation member further includes a workpiece holder coupled to the scan shaft and extending inside the implantation chamber and comprising an electrostatic clamp for holding the workpiece.

28. The workpiece support assembly of claim 27 wherein the electrostatic clamp is rotatable.

29. A method of implanting ions in a workpiece using an beam implanter generating an ion beam for implanting a workpiece and having an implantation chamber wherein a workpiece is positioned to intersect the ion beam for ion implantation of an implantation surface of the workpiece, the steps of the method comprising:

a) providing a workpiece support structure coupled to the implantation chamber and supporting the workpiece, the workpiece support structure including:
1) a rotation member coupled to the implantation chamber for changing an implantation angle of the workpiece with respect to a portion of a beam line of the ion beam within the implantation chamber, the rotation member defining an interior region adjacent the implantation chamber; and
2) a translation member movably coupled to the rotation member and supporting the workpiece for movement along a path of travel, the translation member including a scan shaft extending longitudinally and moving in a direction parallel to the path of travel of the workpiece, at least a portion of the scan shaft extending into the rotation member interior region;

b) positioning the workpiece on the translation member;

c) selecting a desired implantation angle for the workpiece by rotating the rotation member;

d) directing the ion beam at the workpiece; and e) moving the workpiece along a path of travel by moving the translation member such that movement of the translation member maintains a constant distance that the ion beam moves through the implantation chamber before striking the implantation surface of the workpiece.

30. The method of implanting ions in a workpiece of claim 29 wherein the workpiece moves in a linear path.

31. The method of implanting ions in a workpiece of claim 29 wherein the ion beam is a ribbon ion beam when striking the workpiece and the workpiece path of travel is transverse to an extent of the ribbon ion beam and the portion of the beam beam path within the implantation chamber.

* * * * *